(12) United States Patent
Goodrich

(10) Patent No.: US 7,402,842 B2
(45) Date of Patent: Jul. 22, 2008

(54) LIGHT EMITTING DIODE PACKAGE

(75) Inventor: Joel Lee Goodrich, Westford, MA (US)

(73) Assignee: M/A-COM, Inc., Lowell, MA (US)

( * ) Notice: Subject to any disclaimer, the term of this patent is extended or adjusted under 35 U.S.C. 154(b) by 81 days.

(21) Appl. No.: 10/914,361

(22) Filed: Aug. 9, 2004

(65) Prior Publication Data
US 2006/0027826 A1    Feb. 9, 2006

(51) Int. Cl.
*H01L 29/22* (2006.01)
*H01L 33/00* (2006.01)

(52) U.S. Cl. .................................. 257/99; 257/100
(58) Field of Classification Search ................. 362/296, 362/555, 297, 800; 257/98, 99, 100, 81, 257/433
See application file for complete search history.

(56) References Cited

U.S. PATENT DOCUMENTS

| | | | |
|---|---|---|---|
| 4,737,236 A | 4/1988 | Perko et al. | |
| 5,268,310 A | 12/1993 | Goodrich et al. | |
| 5,343,070 A | 8/1994 | Goodrich et al. | |
| 5,502,317 A | 3/1996 | Duvvury | |
| 5,696,466 A | 12/1997 | Li | |
| 5,841,184 A | 11/1998 | Li | |
| 5,877,037 A | 3/1999 | O'Keefe et al. | |
| 5,914,501 A | 6/1999 | Antle et al. | |
| 5,976,941 A | 11/1999 | Boles et al. | |
| 6,014,064 A | 1/2000 | Boles et al. | |
| 6,114,716 A | 9/2000 | Boles et al. | |
| 6,150,197 A | 11/2000 | Boles et al. | |
| 6,191,048 B1 | 2/2001 | Ressler et al. | |
| 6,379,785 B1 | 4/2002 | Ressler | |
| 6,472,688 B2 | 10/2002 | Miyata | |
| 6,486,499 B1 | 11/2002 | Krames et al. | |
| 6,521,914 B2 | 2/2003 | Krames et al. | |
| 6,593,598 B2 * | 7/2003 | Ishinaga ...................... | 257/98 |
| 6,642,072 B2 * | 11/2003 | Inoue et al. .................. | 438/26 |
| 6,642,550 B1 | 11/2003 | Whitworth et al. | |
| 6,876,008 B2 | 4/2005 | Bhat et al. | |
| 2003/0085416 A1 | 5/2003 | Brogle et al. | |
| 2004/0184270 A1 * | 9/2004 | Halter ......................... | 362/296 |
| 2005/0269695 A1 | 12/2005 | Brogle et al. | |

OTHER PUBLICATIONS

Steigerwald et al., Illumination with Solid State Lighting Technology, IEEE Journal on Selected Topics in Quantum Electronics, vol. 8, No. 2, Mar./Apr. 2002, pp. 310-320.

Glen Zorpette, Let There Be Light, Ieee Spectrum, Sep. 2002, pp. 70-74.

Correct Figures 1-6 for Document U.S. 2005/0269695; U.S. Appl. No. 10/862,710, Filed Jun. 7, 2004.

* cited by examiner

*Primary Examiner*—John Anthony Ward

(57) ABSTRACT

A light emitting diode package and method of manufacturing the light emitting diode package are provided. The light emitting diode package includes a sub-mount portion and a frame portion extending from the sub-mount portion. The frame portion has angled walls and is configured to receive a light emitting diode therein.

21 Claims, 4 Drawing Sheets

LIGHT EMITTING DIODE PACKAGE

BACKGROUND OF THE INVENTION

This invention relates generally to light emitting diodes (LEDs), and more particularly, to packaging of LEDs.

LEDs are light sources that are illuminated using a semiconductor material, unlike ordinary incandescent and fluorescent light sources. LEDs are much more efficient than ordinary incandescent and fluorescent light sources, with a much higher percentage of the electrical power going directly to generating light, which reduces electrical power requirements. LEDs also have a longer useful life. Some LEDs may emit visible light having different colors. These LEDs also are referred to as visible LEDs (VLEDs). Other LEDs emit light not visible to the human eye, for example, infrared energy. These LEDs also are referred to as infrared LEDs (ILEDs).

LEDs typically have a transparent package surrounding the semiconductor material (i.e., diode) thereby allowing the visible light or infrared energy to pass therethrough. This transparent package is typically formed in a dome shape to collect and focus the light emitted from the LED.

As the cost of manufacturing LEDs has decreased, their use in everyday applications has increased, due in part to their low power requirements, high efficiency and long life. For example, LEDs are used in indicator lights (e.g., alphanumeric readouts or signal lights on vehicles), in panel backlighting (e.g., flat-panel computer displays), for data transmission (e.g., fiber optic data transmission), as an optoisolator (e.g., connecting components within in a system without a physical connection) and for remote controls (e.g., television remote control).

However, because of the configuration of the LEDs, for example the use of flip chip LEDs on surface mount packages, light emitted from portions of the package is lost from the optical axis (e.g., light emitted from edges of the chip). Thus, the electrical to optical efficiency is reduced. Further, this can reduce the overall brightness and effectiveness of the LED.

BRIEF DESCRIPTION OF THE INVENTION

According to an exemplary embodiment, a light emitting diode package is provided that includes a sub-mount portion and a frame portion extending from the sub-mount portion. The frame portion has angled walls and is configured to receive a light emitting diode therein.

According to another exemplary embodiment, a light emitting diode assembly is provided that includes a sub-mount portion formed from a silicon substrate and defining a surface mount package for mounting a light emitting diode thereon. The light emitting diode assembly further includes a frame portion etched from a silicon wafer and having a cavity defined by angled walls. The cavity is configured to receive the light emitting diode therein and the angled walls are configured at an angle of about 54.7 degrees.

According to yet another exemplary embodiment, a method of manufacturing a package for a light emitting diode is provided. The method includes forming at least one sub-mount portion for mounting a light emitting diode thereon and forming at least one frame portion defining a cavity for receiving the light emitting diode therein. The frame portion has angled walls. The method further includes forming a package for a light emitting diode from the at least one sub-mount portion and the at least one frame portion.

DETAILED DESCRIPTION OF THE INVENTION

Figure 1:
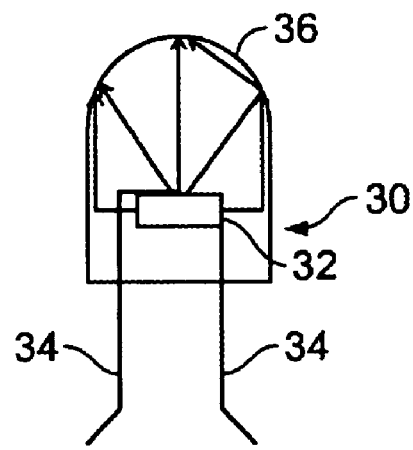
FIG. 1 is an elevation view of a typical light emitting diode (LED).

FIG. 1 illustrates an exemplary embodiment of a typical light emitted diode (LED) assembly 30. The LED assembly 30 includes a diode 32 (e.g., LED) powered through terminal pins 34 for generating light or other energy. The diode 32 is typically constructed of a P-type semiconductor and an N-type semiconductor forming a PN junction. The PN junction may be configured (e.g., shaped) based on the particular application for the LED assembly 30.

A transparent housing 36 is provided over the diode 32 for collecting and focusing light emitted from the diode 32 as shown by the arrows in FIG. 1. In operation, as electrical current flows through the diode 32 via the terminal pins 34, the diode 32 is configured in a known manner to emit, for example, visible light and/or infrared light. The light emitted is typically monochromatic occurring at a single wavelength.

Figure 2:
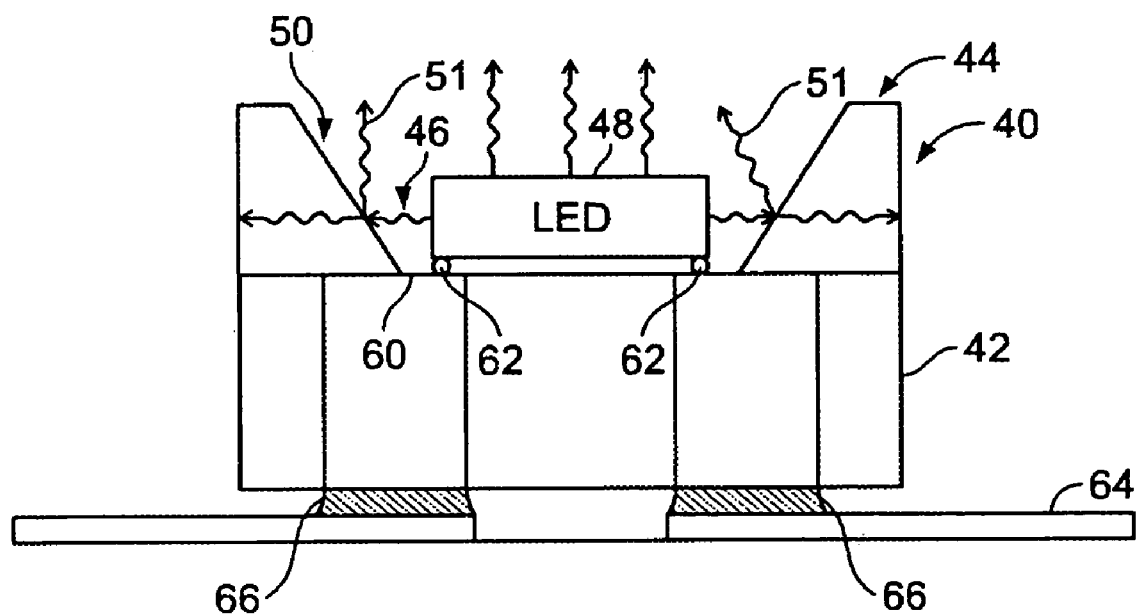
FIG. 2 is a diagram illustrating an LED package constructed in accordance with an exemplary embodiment of the invention.
Figure 4:
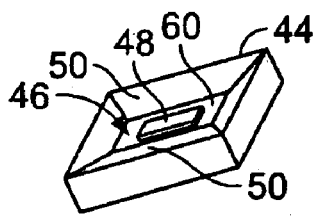
FIG. 4 is a perspective view of a frame portion of an LED package forming a cavity in accordance with an exemplary embodiment of the invention.

Various embodiments of the present invention provide an LED package or assembly for collecting and focusing light emitted by a diode within the LED package. For example, edge emitted light is focused to the optical axis of the LED package. Specifically, and as shown in FIG. 2, a LED package 40 generally includes a sub-mount portion 42 and a frame portion 44. The frame portion forms a cavity 46 as shown more clearly in FIG. 4 for receiving a diode, and more particularly, an LED 48 therein. In one embodiment, the LED 48 is mounted within the cavity 46 formed by the frame portion 44 and on the sub-mount portion 42.

The frame portion 44 is configured having angled walls 50 that include a reflective surface for redirecting and focusing light emitted from the LED 48. More particularly, the angled walls 50, in one embodiment, are formed as part of the frame portion 44 from a reflective silicon (e.g., etched in a silicon wafer). In one embodiment wherein the frame portion 44 is formed from a reflective silicon, the angled walls 50 are etched at an angle of approximately 54.7 degrees relative to a base or mounting portion 60 of the LED package 40.

It should be noted that the angle of the angled walls 50 may be modified and/or adjusted based on the particular application or requirements for the LED package 40 and/or the type of material forming the frame portion 44 in which the angled walls 50 are formed. For example, in other embodiments, the angled walls 50 may be angled between approximately 45 degrees and approximately 65 degrees. Further, and for example, the reflective surface of the angled walls 50 may be provided with different materials. For example, in one embodiment, the angled walls 50 are metalized (e.g., coated with a metal) to provide a mirrored surface.

In the various embodiments, the frame portion 44 is bonded to the sub-mount portion 42 using a polymer or adhesive (e.g., BCB) to form a single unitary assembly. The sub-mount portion 42 may be any suitable mounting portion, including, for example, a chip scale or surface mount package, and/or a multi-layer laminated board structure such as a printed circuit board. Further, the sub-mount portion 42 may be a surface mount package having one or more protection elements (e.g., zener diodes) integrated therewith. For example, the sub-mount portion 42 may be a chip-scale package, such as described in U.S. patent application entitled "Surface-Mount Chip-Scale Package" having Ser. No. 10/862,710 and filed on Jun. 7, 2004.

In one exemplary embodiment, the sub-mount portion 42 is formed from a silicon material (e.g., silicon wafer) with the frame portion 44 also formed from a silicon material (e.g., silicon wafer) and etched to form the angled walls 50. It should be noted that the two silicon portions may be bonded together before or after etching the angled walls 50 in the frame portion 42. The process for manufacturing the LED package 40 is described in more detail below in connection with FIG. 7.

Thus, as shown in FIG. 2, an LED package 40 is formed such that an LED 48 is mounted to a sub-mount portion 42, which may include mounting portions 62 (e.g., contacts) onto which the LED 48 is mounted (e.g., soldered). The sub-mount portion 42 then may be mounted on a device, for example, a printed circuit board 64, via connection members 66 (e.g., metal plates). Thus, the LED 48 may be connected to a printed circuit board 64 through the sub-mount portion 42. The LED package 40 then may be integrated, for example, within a larger system (e.g., television remote control).

In the various embodiments, the frame portion 44 is configured such that the LED 48 mounted within the cavity 46 is located in close proximity to the angled walls 50. The size and shape of the cavity 46 is configured based on the size and shape of the LED 48 to be mounted within the cavity 46. Thus, if the LED 48 is generally rectangular in shape, the cavity portion 46 will be formed (e.g., etched) in a generally rectangular shape and sized based on the size of the LED 48. For example, in one embodiment, lower edges of the LED 48 and lower edges of the angled walls 50 are separated by a distance of between about five micrometers (microns) and about thirty microns, for example, ten microns. However, this distance may be modified based on the application and focusing requirements for the light emitted from the LED 48. It should be noted that the cavity portion 46 is not limited to a generally rectangular shape, but may be configured in any geometric shape or pattern as desired or needed.

In the various embodiments, the height of the angled walls 50 is configured based on the height of the LED 48 to be mounted within the cavity 46. For example, for use in connection with many common LEDs 48, the angled walls 50 have a height of between about 100 microns and about 150 microns. In general, the height of the angled walls 50 is higher than the height or thickness of the LED 48. For example, the height of the angles walls 50 is between about fifty percent greater and about one hundred percent greater than the height or thickness of the LED 48.

The LED package 40 is configured such that light emitted from the sides or edges of the LED 48 is redirected or reflected by the angled walls 50 back into the optical axis of the LED package 40 as shown by the arrows 51 in FIG. 2. Thus, light emitted from the sides or edges of the LED 48 is collected and focused into the optical axis.

Figure 3:
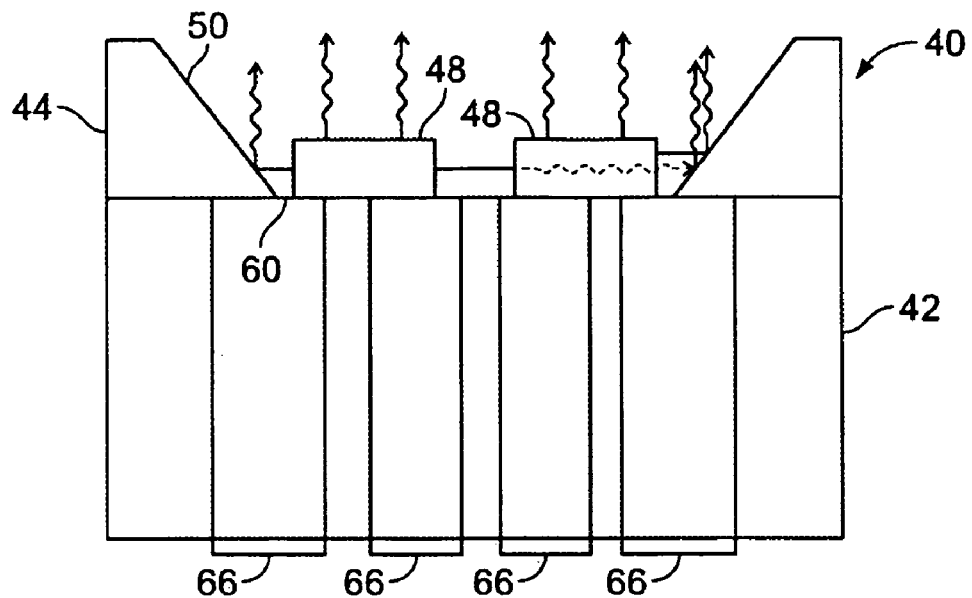
FIG. 3 is a diagram illustrating an LED package constructed in accordance with another exemplary embodiment of the invention.

It should be noted that the frame portion 44 forming the cavity 46 may be configured for receiving and mounting more than one LED 48 therein. For example, as shown in FIG. 3, the frame portion 44 may be configured to form a cavity 46 for mounting a plurality of LEDs 48 therein. In operation, light emitted from the edge or side of one LED 48 and directed toward another LED 48, will pass through the other LED 48 (as shown in dashed lines in FIG. 3) and be reflected by the angled walls 50 as described herein. The size and shape of the cavity 46 is determined based on the size and shape of the plurality of LEDs 48 mounted therein. Further, the sub-mount portion 42 may be configured to include mounting portions 62 (shown in FIG. 2) for mounting each of the LEDs 48 and to properly position the LEDs 48 within the cavity 46, for example, a predetermined distance from the angled walls 50.

Figure 5:
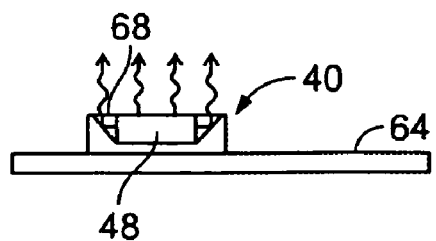
FIG. 5 is an elevation view of an LED package constructed in accordance with an exemplary embodiment of the invention mounted to a device.

Thus, and as shown in FIG. 5, one or more LED packages 40 may be mounted to a device, for example, to a printed circuit board 62. The LED package is encapsulated or over-coated with a coating 68 to protect the components within the LED package 40. The coating 68 in one embodiment is applied over the LED package 40 and forms a generally planar layer on top of the LED package 40. In another embodiment, only the LED 48 mounted within the LED package 40 is overcoated. The overcoating may be provided by any suitable material, such as, for example, a clear or transparent plastic to allow light (e.g., monochromatic light) emitted from the LED 48 to pass therethrough. Alternatively, a phosphor overcoating may be applied to provide a white emitted light.

Figure 6:
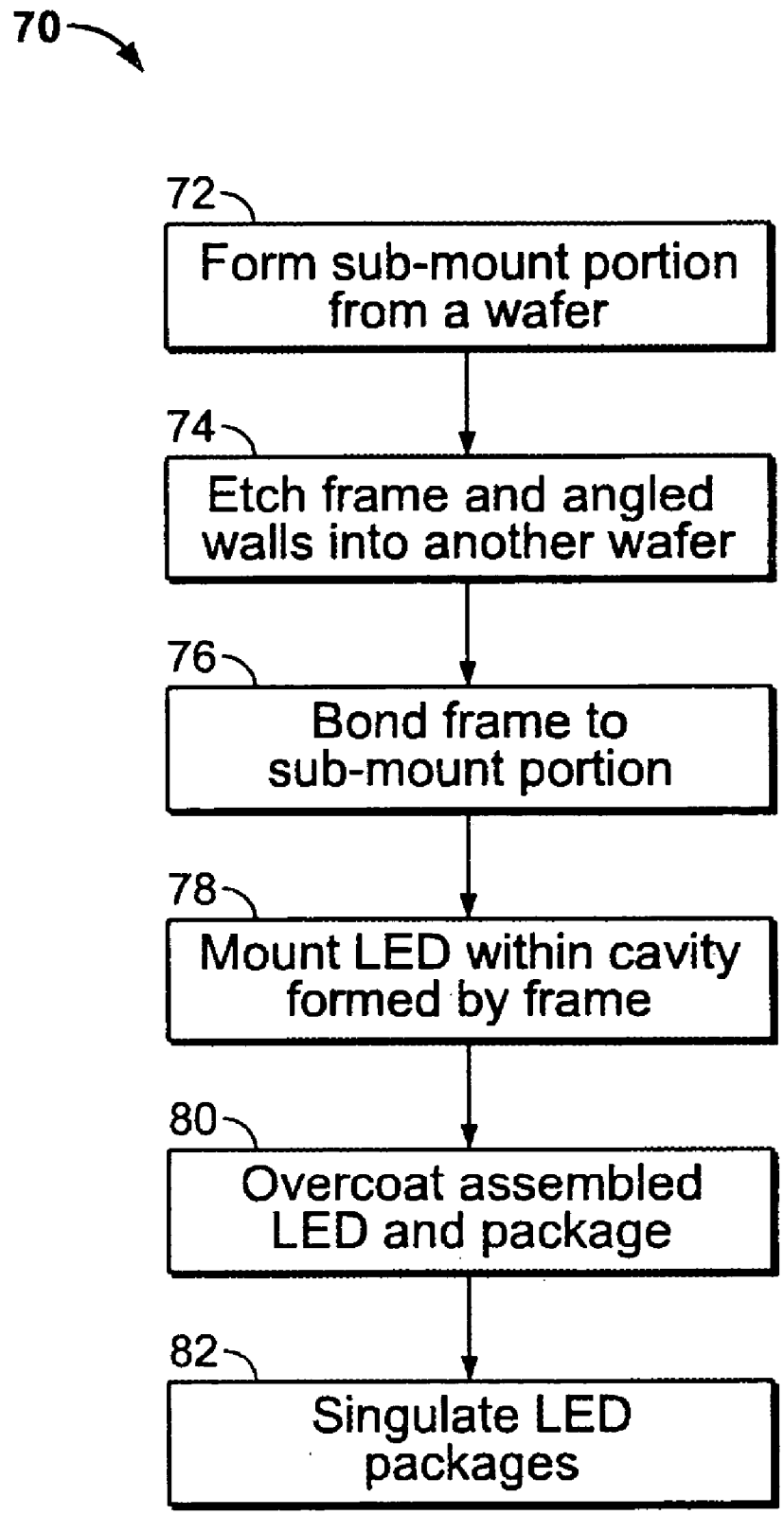
FIG. 6 is a flowchart illustrating a process for manufacturing an LED package in accordance with an exemplary embodiment of the invention.

An exemplary process 70 for manufacturing an LED package 40 is shown in FIG. 6. With reference also to the chip scale package 40 as shown in FIG. 2, at 72 the sub-mount portion 42 is formed from, for example, a silicon wafer. In one embodiment, a surface-mount chip-scale package as is known is formed from the silicon wafer. The surface-mount chip-scale package may include integrated protection elements (e.g., zener diodes) as described herein. Thereafter, at 74, the frame portion 44 and angled walls 50 are formed in another silicon wafer to define the cavity 46. In one embodiment, the frame portion 44 and angled walls 50 are etched in a silicon wafer as is known with the angled walls 50 having an angle of about 54.7 degrees. The shape and size of the frame portion 44 may be formed based on the shape and size of the LED 48 to be mounted in the cavity 46. The silicon wafer, in one embodiment, is a highly reflective silicon such that the angled walls 50 have a highly reflective surface once etched. Alternatively, the angled walls 50 may be metalized (e.g., metal coated) to provide a reflective or mirrored surface.

Figure 7:
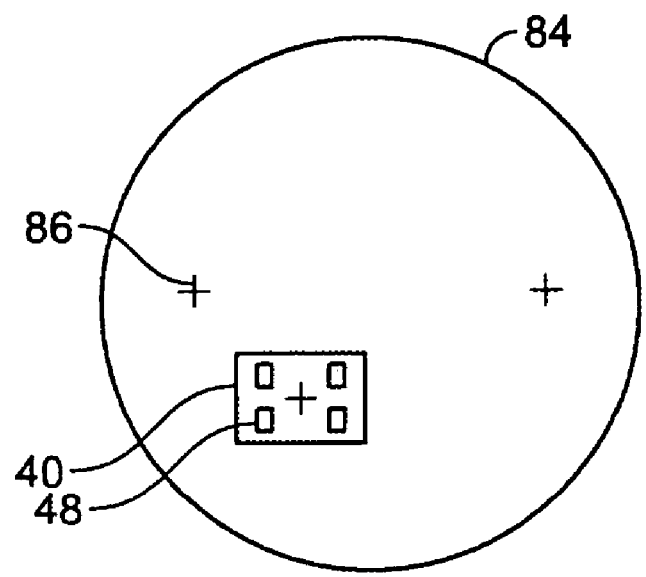
FIG. 7 is a top plan view of an LED package formed as part of a wafer in accordance with an exemplary embodiment of the invention.

At 76, the frame portion 44 is then bonded to the sub-mount portion 42, for example, using a polymer or adhesive. Essentially, an etched wafer that has been etched to form the frame portion 44 with angled side walls 50 is mounted to a substrate wafer that has been processed to form the sub-mount portion 42. For example, in one embodiment, the two wafers are aligned, a polymer or adhesive applied therebetween, the wafer temporarily connected, for example, using clamps, and the polymer or adhesive cured (e.g., baked). Alignment markers 86 (as shown in FIG. 7) may be provided on the wafers to ensure that one or more cavities 46 formed in the frame align with mounting portions 62 on the sub-mount portion 42 for mounting LEDs 48 thereto. It should be noted that in another embodiment, the two wafers are bonded together first with the etching process performed thereafter to form the one or more cavities 46.

Thereafter, at 78, one or more LEDs 48 are mounted within the one or more cavities 46. For example, the LEDs 48 may be soldered to mounting portions 62 within the cavities 46 that are formed on the sub-mount portion 42. Then, at 80, the chip scale package 40 formed by the sub-mount portion 42 and frame portion 44 is encapsulated or overcoated with, for example, a clear or transparent plastic, or a phosphor coating. It should be noted that the entire LED package 40, a portion thereof (e.g., a top surface) or specific components therein (e.g., LED 48) may be encapsulated or overcoated. Finally, at 84 the wafers are singulated, as is known, into one or more LED packages 40, each having one or more cavities 46 with one or more LEDs 48 within each of the cavities 46.

It should be noted that the mounting of the LEDs 48 within the cavities 46 and the encapsulation of the LED packages 40 may be performed before or after the LED packages 40 are singulated from the wafer.

Figure 8:
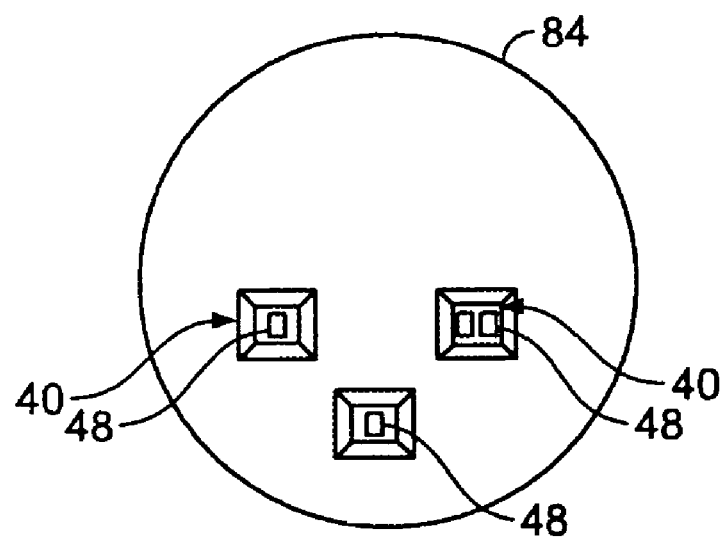
FIG. 8 is a top plan view of an LED package formed as part of a wafer in accordance with another exemplary embodiment of the invention.

Thus, as shown in FIGS. 7 and 8, an LED package 40 may be formed by one or more wafers 84 and configured such that one or more LEDs 38 may be mounted within one or more cavities 46. Through wafer level processing, an LED package 40 having angled walls 50 is configured to collimate (e.g., collect and focus) light emitted from one or more LEDs 48 mounted within the LED package 40.

While the invention has been described in terms of various specific embodiments, those skilled in the art will recognize that the invention can be practiced with modification within the spirit and scope of the claims.

What is claimed is:

1. A light emitting diode package comprising:
a sub-mount portion; and
a frame portion extending from the sub-mount portion, the frame portion having angled walls and configured to receive a light emitting diode therein, and wherein each of the sub-mount portion and frame portion are formed from silicon wafers bonded together.

2. A light emitting diode package in accordance with claim 1 further comprising a cavity formed by the frame portion and configured for mounting at least one light emitting diode therein.

3. A light emitting diode package in accordance with claim 1 wherein the angled walls are configured at an angle of about 54.7 degrees to redirect light emitted from a light emitting diode mounted in the frame portion.

4. A light emitting diode package in accordance with claim 1 wherein the sub-mount portion comprises a surface-mount chip-scale package.

5. A light emitting diode package in accordance with claim 1 further comprising a metalized surface on the angled walls.

6. A light emitting diode package in accordance with claim 1 wherein at least one of the frame portion and a light emitting diode within the frame portion is overcoated.

7. A light emitting diode package in accordance with claim 6 wherein the overcoating forms a generally planar layer over the frame portion.

8. A light emitting diode package in accordance with claim 1 wherein a distance between a lower edge of a light emitting diode within the frame portion and a lower edge of the angled walls is about ten microns.

9. A light emitting diode package in accordance with claim 1 wherein a plurality of frame portions forming a plurality of cavities are etched within a silicon wafer, and wherein the plurality of cavities are each configured to receive therein at least one light emitting diode.

10. A light emitting diode assembly comprising:
a sub-mount portion formed from a silicon substrate and defining a surface mount package for mounting light emitting diodes thereon; and
a plurality of frame portions etched from a silicon wafer and forming a plurality of cavities defined by angled walls, the plurality of cavities each configured to receive at least one of the light emitting diodes therein and wherein at least one of the plurality of cavities includes a plurality of light emitting diodes therein.

11. A light emitting diode assembly in accordance with claim 10 wherein a distance between a lower edge of the light emitting diode and a lower edge of the angled walls is between about five microns and about thirty microns.

12. A light emitting diode assembly in accordance with claim 10 further comprising a metalized surface on the angled walls.

13. A light emitting diode assembly in accordance with claim 10 further comprising an overcoating layer on one of the frame portion and light emitting diode.

14. A light emitting diode assembly in accordance with claim 10 wherein at least one of a shape and size of the cavity is configured based on one of a shape and size of the light emitting diode.

15. A light emitting diode assembly in accordance with claim 10 wherein the angled walls are configured at an angle of between about 45 degrees and about 65 degrees.

16. A method of manufacturing a package for a light emitting diode, said method comprising:
forming at least one sub-mount portion for mounting a light emitting diode thereon, the sub-mount portion having at least one protection element integrated therewith;
forming separately at least one frame portion defining a cavity for receiving the light emitting diode therein, the frame portion having angled walls; the at least one frame portion attached to the at least one sub-mount portion; and
forming a package for a light emitting diode from the at least one sub-mount portion and at least one frame portion, and wherein the at least one sub-mount portion and at least one frame portion are formed from silicon material.

17. A method in accordance with claim 16 further comprising encapsulating at least one of the frame portion and the light emitting diode.

18. A method in accordance with claim 16 further comprising forming a mirrored surface on the angled walls.

19. A method in accordance with claim 16 further comprising mounting the sub-mount portion to a printed circuit board.

20. A method in accordance with claim 16 wherein the angled walls are configured at an angle of about 54.7 degrees and configured to redirect light emitted from a light emitting diode within the frame portion.

21. A method in accordance with claim 16 wherein the angled walls are configured at an angle of between about 45 degrees and about 65 degrees.

* * * * *